United States Patent [19]

Schürmeyer et al.

[11] 4,070,655
[45] Jan. 24, 1978

[54] VIRTUALLY NONVOLATILE STATIC RANDOM ACCESS MEMORY DEVICE

[75] Inventors: Fritz L. Schürmeyer, Yellow Springs; Charles R. Young, Xenia, both of Ohio

[73] Assignee: The United States of America as represented by the Secretary of the Air Force, Washington, D.C.

[21] Appl. No.: 734,159

[22] Filed: Nov. 5, 1976

[51] Int. Cl.² ............................................ G11C 11/40
[52] U.S. Cl. ................... 365/156; 340/173 R; 365/181; 365/154; 365/184
[58] Field of Search .......... 340/172.5, 173 R, 173 SP; 307/238

[56] References Cited
U.S. PATENT DOCUMENTS 3,831,155  8/1974  Tamaru .................... 340/173 LI Primary Examiner—Terrell W. Fears
Attorney, Agent, or Firm—Joseph E. Rusz; Robert Kern Duncan

[57] ABSTRACT

A high density, static, virtually nonvolatile, Random Access Memory (RAM) cell is disclosed in which variable threshold n-channel depletion mode Metal-Nitride-Oxide-Semiconductor (MNOS) transistors are the load devices for a pair of active, n-channel, enhancement mode, Insulated Gate Field Effect Transistors (IGFETs) in a flip-flop circuit. N-channel enhancement mode access transistors also IGFETs connect the cell to the bit line and the $\overline{\text{bit}}$ line. Information is written in, and read, in volatile form conventionally. A +25 volt, 10 msec pulse applied to the gates of the depletion mode MNOS load devices transfers the data from the volatile mode to the nonvolatile mode.

2 Claims, 4 Drawing Figures

VIRTUALLY NONVOLATILE STATIC RANDOM ACCESS MEMORY DEVICE

RIGHTS OF THE GOVERNMENT

The invention described herein may be manufactured and used by or for the Government of the United States for all governmental purposes without the payment of any royalty.

BACKGROUND OF THE INVENTION

The field of the invention is in solid state memory devices and more particularly in nonvolatile random access memory devices.

Static volatile RAM memory cells are well known. Nonvolatile memory cells have recently been disclosed. Typical prior art devices are exemplified by U.S. Pat. No. 3,881,180 to patentee Gosney; U.S. Pat. No. 3,877,055 to patentees Fisher and Powell; U.S. Pat. No. 3,845,327 to patentee Cricchi; and U.S. Pat. No. 3,683,335 to patentees Cricchi and Beydler. The concept of virtually nonvolatile data storage also was presented by J. C. Lockwood et al at the 1972 WESCON, Sept. 19-22, 1972, Los Angeles, CA.

The novelty of the present invention resides primarily in the combination comprising variable threshold load devices in a static RAM cell and the method of operation of MNOS transistors in an n-channel circuit.

SUMMARY OF THE INVENTION

A virtually nonvolatile RAM cell fabricated on n-channel substrate with depletion mode MNOS transistor as variable threshold load devices provides a high density, high performance memory cell.

DESCRIPTION OF THE PREFERRED EMBODIMENT

Figure 1:
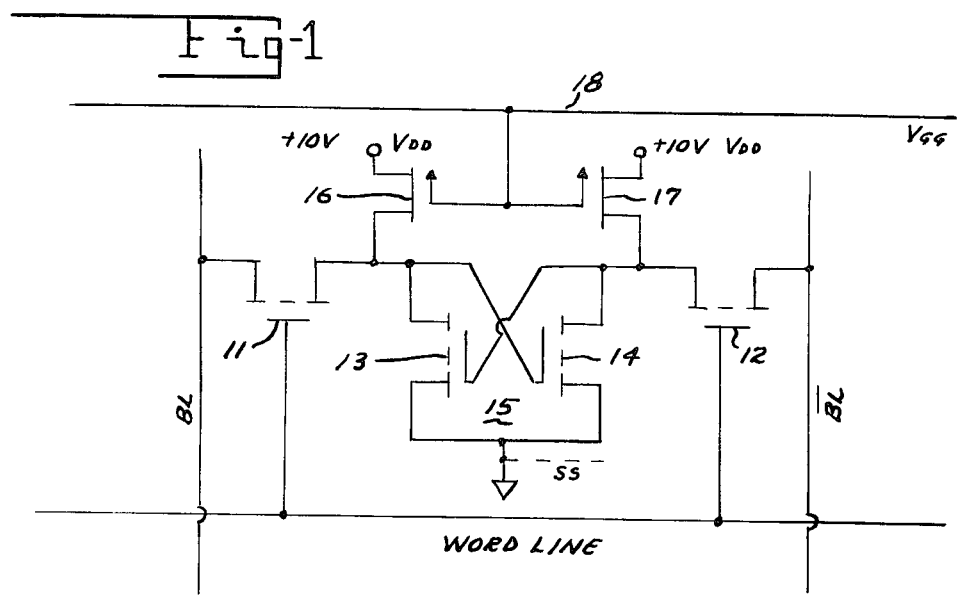
FIG. 1 illustrates schematically an embodiment of a typical memory cell of the invention.
Figure 3:
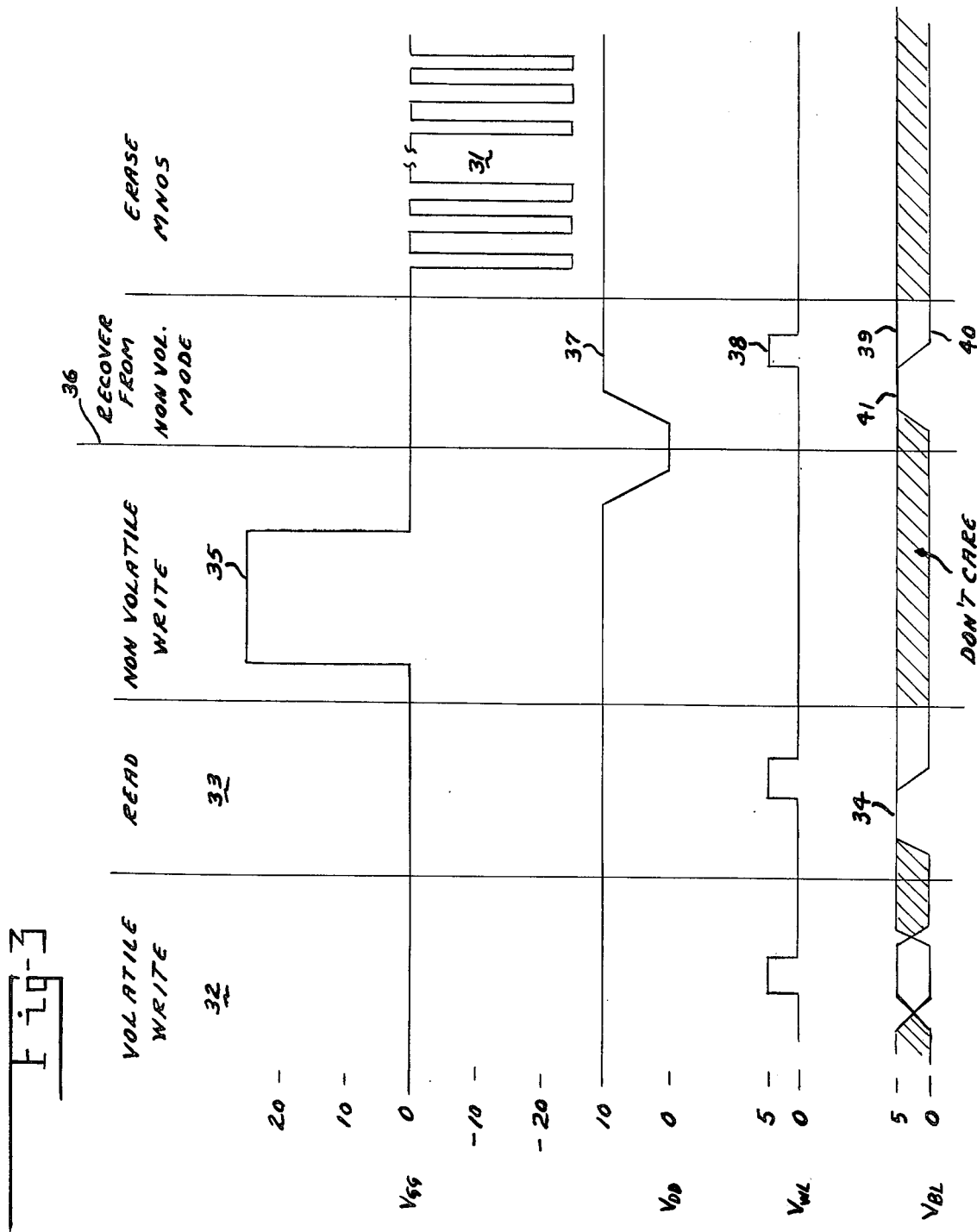
FIG. 3 is a timing plot illustrating typical waveforms showing the method of operation of the invention.

The invention comprises a memory bit storage cell as schematically diagrammed in FIG. 1 and the method of operation of the cell as diagrammed in FIG. 3. The fabrication of numerous types of solid state elements in various substrates of either $n$ or $p$ type material is well known. Also it is common practice to fabricate a vast multiplicity of elements in a matrix arrangement on a single semiconductor chip.

FIG. 1 is a schematic diagram showing the preferred structural formation of an embodiment of a memory cell. The cell comprises enhancement mode, IGFETs, 11, 12, 13 and 14. Transistors 11 and 12 are access transistors, 13 and 14 are active transistors comprising flip-flop 15. The loads on the branches of the flip-flop are the depletion mode MNOS transistors 16 and 17. The substrate for all the foregoing is conventional n-channel. The depletion mode MNOS transistors 16 and 17 are also conventional "source-drain" protected type and have typical I-V characteristics as shown in FIG. 2.

It is important that the cutoff voltage be larger than the turn on voltage of the fixed threshold voltage n-channel elements such that the current from the load devices can sustain the flip-flop state. As is conventional practice, the substrate connection which is common with all the transistor elements is not shown in FIG. 1. The common practice of diagramming the connection to the gate electrode opposite the source electrode is used for the flip-flop transistor pair 15 and for the variable threshold load transistors 16 and 17. The access transistors 11 and 12 are symmetrical transistors with the effective source and drain electrodes interchanging with the change in modes from read to write. The effective drain electrode is connected to the bit line when in the read mode.

Figure 2:
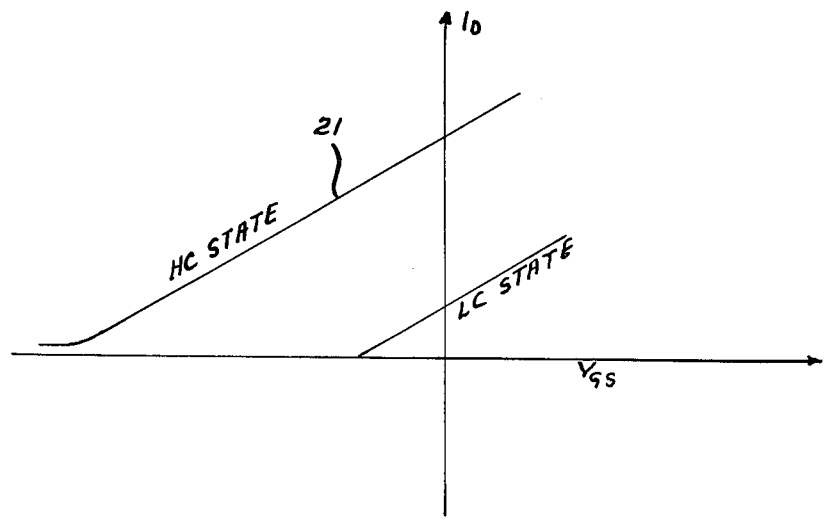
FIG. 2 illustrates graphically the current-voltage characteristics of typical depletion mode MNOS transistors of the invention.

The following description of the operation of the invention may best be understood when considered with the drain current $I_D$ versus gate to source voltage $V_{GS}$ characteristics of a typical depletion mode MNOS device as illustrated in FIG. 2, and the waveform voltage operating levels versus time as illustrated in FIG. 3. The cell is first made ready for volatile data storage by applying an erase pulse, or preferably a series of pulses as shown at 31, FIG. 3, to the gate line $V_{GG}$, (18, FIG. 1). This places both MNOS transistors 16 and 17 in the high conduction (HC) state, (21, FIG. 2), and the cell is ready for data storage. With the MNOS devices 16 and 17 in a high conductance state the volatile write and read process for the disclosed cell and the conventional standard cell are identical and well known. These modes are diagrammed at 32 and 33 of FIG. 3. In the read mode the bit lines (both bit and $\overline{\text{bit}}$ must be precharged to a voltage level 34 which exceeds the turn on voltage of the active transistors (13 and 14, FIG. 1) of the memory cell. The 5 volt level as illustrated is typical.

To transfer data from the volatile form into the nonvolatile form a large positive pulse 35 is applied to the gate lines $V_{GG}$ of the variable threshold MNOS devices. For typical conventional IGFET, MNOS, n-channel devices a pulse 35 of approximately +25V for approximately 10 msec (as illustrated) has been found to be a generally optimum value. To recover data from a power-down period, in which all exterior control voltages are zero, as illustrated at time 36, the drain voltage $V_{DD}$, 37, (typically 10 volts), is reapplied to the MNOS devices, then the word line is pulsed 38 and the bit lines read 39, 40 in the conventional manner to provide the stored information. (The bit lines are precharged 41 in the conventional manner.) After recovery of the data from the nonvolatile state, the MNOS transistors are put into the HC state by applying a series of −25V, 100 μsec pulses 31 to the gate line as previously mentioned. For read mostly applications, the MNOS transistors should remain in the previously written condition and the erase mode 31 in FIG. 3 is omitted.

Figure 4:
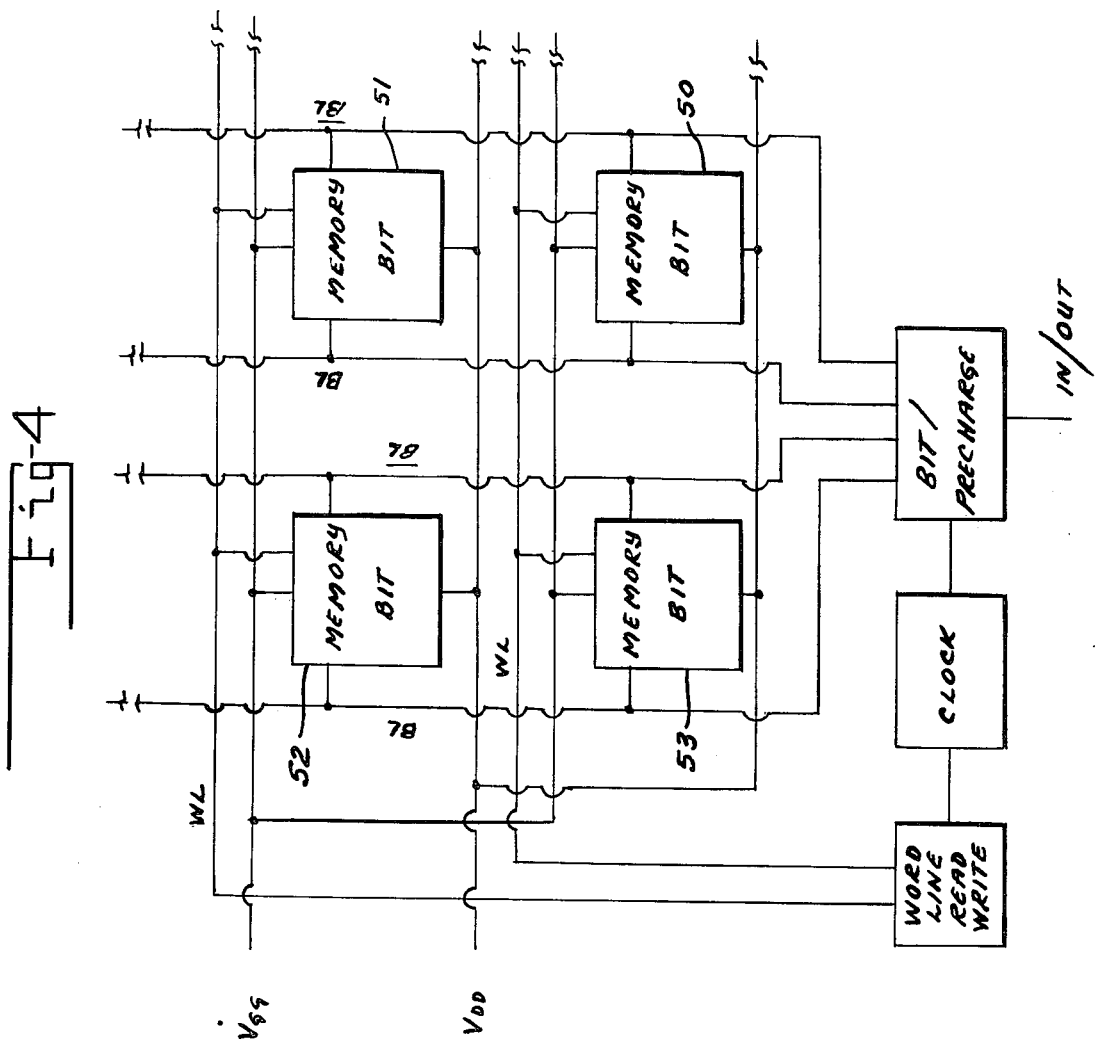
FIG. 4 is a representative block diagram illustrating typical circuitry for cooperating with storage cells of the invention.

The integrated circuit memory chip as partially illustrated in FIG. 4, typically contains many memory bit cells, e.g., 50, 51, 52, 53, etc., each cell fabricated as schematically diagrammed in FIG. 1. The conventional peripheral circuitry as schematically illustrated in FIG. 4 includes the decode, sense, and other necessary circuits.

We claim:

1. A solid state RAM cell for a memory system having a $\overline{\text{bit}}$ line, a bit line, a word line, a gate line, and a drain line, the said cell comprising:

a. an n-channel substrate;

b. a first IGFET enhancement mode access transistor fabricated on the said n-channel substrate cooperating with the said bit line and the said word line;
c. a second IGFET enhancement mode access transistor fabricated on the said n-channel substrate cooperating with the said $\overline{\text{bit}}$ line and the said word line;
d. a first and a second IGFET enhancement mode, active transistors fabricated on the said n-channel substrate and cooperating with each other to provide a flip-flop;
e. a first MNOS, IGFET depletion mode variable threshold transistor, fabricated on the said n-channel substrate, having a drain electrode connected to the said drain line, a gate electrode connected to the said gate line and a source electrode;
f. a second MNOS, IGFET depletion mode variable threshold transistor, fabricated on the said n-channel substrate, having a drain electrode connected to the said drain line, a gate electrode connected to the said gate line, and a source electrode;
g. means for connecting the said first access transistor and the said flip-flop to the said source electrode of the first variable threshold transistor, and the said second access transistor and the said flip-flop to the said source electrode of the second variable threshold transistor whereby a nonvolatile RAM is provided.

2. In a random access memory device having enhancement mode active IGFET transistors with depletion mode MNOS variable threshold IGFET loads, all on n-channel material, and with a bit line, a $\overline{\text{bit}}$ line, a drain voltage line, a word line, and a gate line, the method of transferring data conventionally stored in volatile form to non-volatile storage, recovering the data, and erasing the device, comprising the steps of:
a. applying a positive pulse to the said gate line for transferring the said data stored in volatile form to nonvolatile form;
b. applying drain voltage, precharging the bit lines, and pulsing the word line to recover the said data after nonvolatile storage; and
c. erasing the said memory device by applying a series of negative pulses to the said gate line.

* * * * *